STACKED PRINTED CIRCUIT BOARD

Filed April 7, 1966

INVENTORS:
VICTOR F. DAHLGREN
SIDNEY K. TALLY
THOMAS H. STEARNS
BY
Brumbaugh, Free, Graves & Donohue
THEIR ATTORNEYS United States Patent Office 3,409,732
Patented Nov. 5, 1968

3,409,732
STACKED PRINTED CIRCUIT BOARD

Victor F. Dahlgren, Chelmsford, Mass., Sidney K. Tally, Nashua, and Thomas H. Stearns, Amherst, N.H., assignors to Electro-Mechanisms, Inc., Methuen, Mass., a corporation of New Hampshire Filed Apr. 7, 1966, Ser. No. 540,896
4 Claims. (Cl. 174—68.5)

ABSTRACT OF THE DISCLOSURE

As described herein, a rigid stacked printed circuit board comprises a plurality of conductors and one or more flexible printed circuit cables united with the circuit board and extending from its periphery. The extended portions of the flexible cables contain terminals in which components may be placed and to which connections can be made. Further provided within the main portion of the board are a plurality of terminals which extend through the flexible cables and the circuit board and which connect selected conductors in the circuit board to the conductors in the flexible cables.

This invention relates to printed circuit boards and, more particularly, to stacked or multiplanar printed circuit boards which include flexible printed cables.

The techniques of making printed circuits for use in the electronics field are well known. Printed circuits are made usually by adhering a copper foil to a supporting base of insulating material, applying a resist to the foil to cover the areas of the conductors to be formed in the circuit and etching away the exposed metal.

As described in our copending application, Ser. No. 281,273 filed May 17, 1963, now issued Patent No. 3,264,524 dated Aug. 2, 1966, a cover layer of an electrically insulating plastic may be applied to the exposed surface of the copper foil and united with the insulating base to form either a flexible member or a relatively rigid member containing one or more layers of such conductors, depending upon the type of plastic or plastic reinforcements used in the insulating base and cover. In the rigid bases, thin layers of glass fiber fabrics are commonly used, while in the flexible cables or circuits, the rigidifying fabric is omitted.

Methods of applying terminals to a printed circuit board of the above-mentioned type, are described in our applications Ser. No. 281,273 filed May 17, 1963, now issued Patent No. 3,264,524 dated Aug. 2, 1966 and 470,685 filed July 9, 1965, now issued Patent No. 3,325,691 dated June 13, 1967. These applications disclose a method whereby pins, eyelets or tubelets having a surface coating of a high temperature brazing metal, such as a silver brazing alloy having a melting point of 800° F. or higher, are united to each other and to a foil-like conductor of the printed circuit without damage to the conductor or the encapsulating plastic. The methods of applying terminals described in these applications are applicable to flexible and rigid printed circuit boards containing one layer of cables and flexible and rigid printed circuit boards containing a plurality of layers of cables.

In complex electronic equipment, printed circuit boards are very often mounted in a rack or subrack which includes grooves for receiving the boards and are electrically interconnected to each other and to the rest of the equipment by means of surface wiring. Due to the relatively small separations existing between adjacent printed circuit boards and the relative rigidity of the board when mounted in a rack, intra-rack wiring, whereby the terminals of different printed circuit boards are electrically connected, often becomes a painstakingly slow and arduous task.

Moreover, difficulty is encountered when it is desired to add external components or hardware to the printed circuit board or test the components or modules (i.e., small plastic housings which contain electronic components) located on the printed circuit board.

In order to overcome the above-mentioned disadvantages of the prior art and in accordance with the present invention, a printed circuit board including a combination of flexible and rigid cables is provided wherein electrical connections can easily be made and wherein additional electronic components or hardware can easily be added.

More particularly, in accordance with the present invention, a rigid stacked printed circuit board is provided which comprises one or more flexible printed circuit cables extending from its periphery. Advantageously, the extended portion of the flexible cable contains terminals in which additional electronic components or mechanical hardware may be placed or to which connections can be made without interruption of the overall electrical continuity of the printed circuit board and which provide suitable test and connection terminals. There is further provided, within the main portion of the board, a plurality of terminals into which the electronic modules, micro-modules or components, may be inserted or wires connected and which provide suitable mechanical and electrical connections between the terminals of the modules and the foil-like conductors encapsulated in the flexible cable.

For a better understanding of the present invention, reference may be had to the accompanying drawing, in which.

Figure 1:
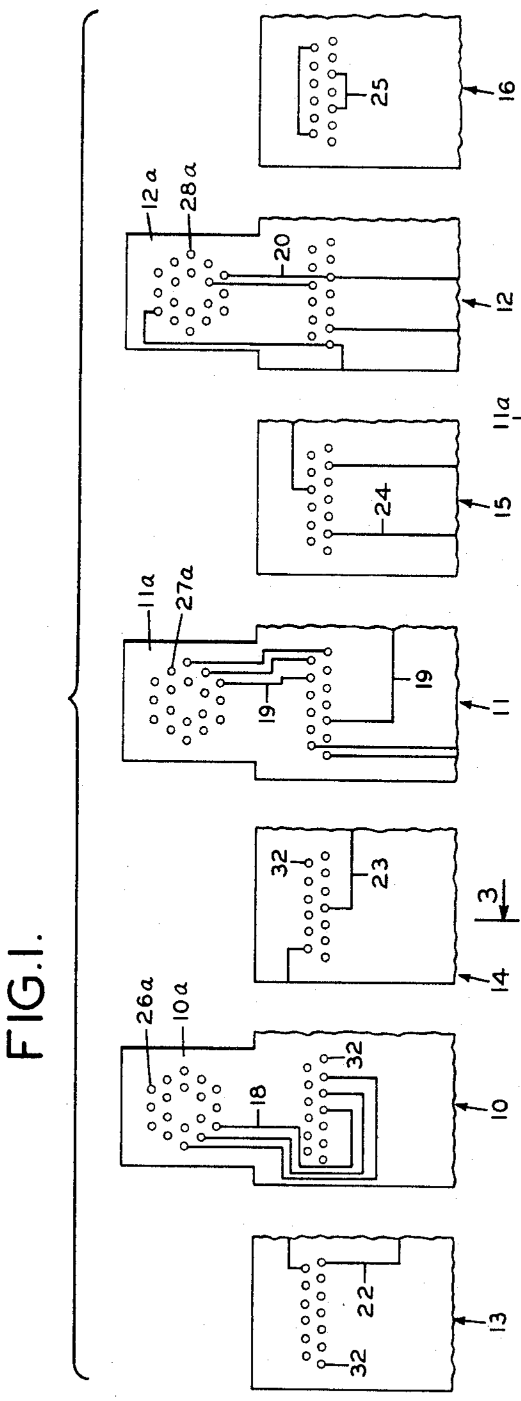
FIGURE 1 is a plan view of portions of the cables which compose one type of rigid stacked printed circuit board.
Figures 2, 3:
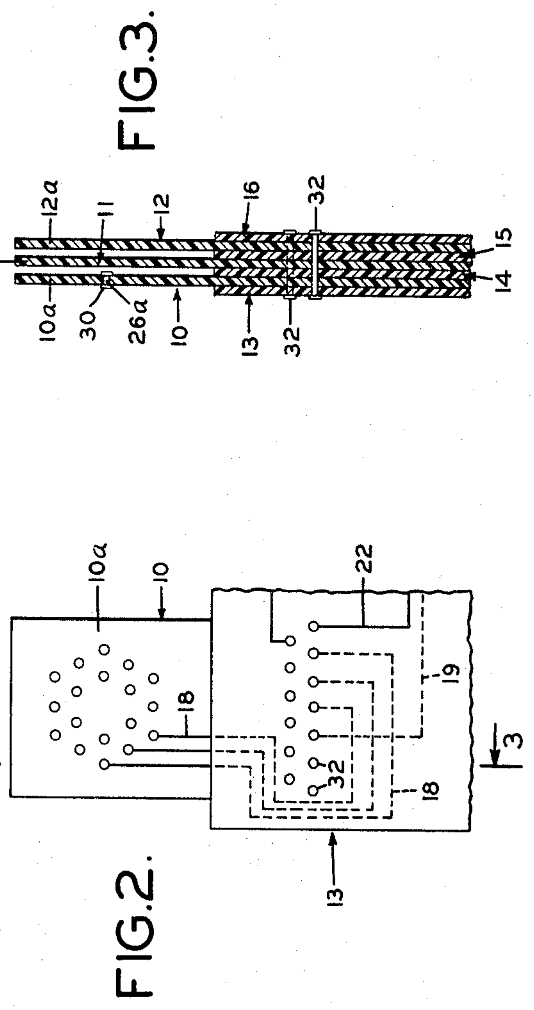
FIGURE 2 is a plan view of a segment of a rigid stacked printed circuit board, having the cables stacked in superposed relation.
FIGURE 3 is a view in cross-section of a rigid stacked printed circuit board taken along line 3—3 of FIGURE 2.

Referring now to the drawing, in accordance with the present invention, a rigid stacked printed circuit board comprises a series of flexible cables or circuits 10, 11 and 12 interposed between and connected selectively with a plurality of rigid cables or circuits 13 and 14, 14 and 15, and 15 and 16, respectively, stacked in the manner shown in FIGURE 3. The rigid and flexible cables may be bonded together by any number of presently known techniques, as, for example, by cementing the cables together with a polyurethane cement or by laminating the circuits together by means of the simultaneous application of heat and pressure as described in application Ser. No. 281,273 filed May 17, 1963, now issued Patent No. 3,264,524 dated Aug. 2, 1966. The flexible cables are cut or formed at greater lengths than the rigid circuit boards with which they are assembled so as to provide extended portions or tabs 10*a*, 11*a* and 12*a* containing a plurality of thin, flexible, conductors 18, 19 and 20, formed of a conductive metal, such as for example copper, which may be formed in any of the known ways, such as for example, by electrode-position, by etching through a resist, or the like.

In order to facilitate mechanical and visual inspection of the rigid stacked printed circuit board shown in the drawing, the flexible cables 10, 11 and 12 are transparent and, preferably, are formed of such materials as Teflon (polytetrafluoroethylene), polyurethane plastics, polyester plastics and the like in which the conductors 18, 19 and 20 are encapsulated. In one method of forming transparent flexible cables with conductive strips, a layer about .002 to .10 inch thick, of a polyurethane plastic is cemented or bonded by heat and pressure to the exposed surfaces of a printed circuit having foil-like conductors which are formed on another layer of plastic by etching through a resist. The layers of plastic encapsulate the circuit conductors and insulate them from exterior circuitry. Suitable plastics are disclosed in application Ser. No. 281,273 filed May 17, 1963, now issued Patent No. 3,264,524 dated Aug. 2, 1966. However, other plastics also may be used. Polyurethane plastics produce a flexible cable of a desired thinness and durability as well as having other properties of a desired nature.

The rigid circuit boards 13, 14, 15 and 16, for the purpose mentioned above, are preferably transparent and, to this end, may be formed of plastic reinforced with a glass fiber fabric or a like material (FIG. 2). The rigid cables similarly include circuit conductors 22, 23, 24 and 25 formed on a support by an etching process or otherwise. Any of the plastics mentioned above are suitable for use in forming the reinforced insulating base and the cover layer.

It can be seen that the flexible cables 10, 11 and 12 require cover layers of plastic only in their extended portions 10*a*, 11*a* and 12*a* since the reinforced insulating bases of the rigid cables serve to insulate the conductors formed in the flexible cables. Thus, the flexible cables can be made such that the cover layer of plastic stops at the edge of the rigid printed circuit boards or can be made such that the plastic cover extends across the rigid printed circuit boards.

As described in our application Ser. No. 470,685 filed July 9, 1965, now issued Patent No. 3,325,691 dated June 13, 1967, the encapsulating plastic of the rigid and flexible printed circuit boards overlie rounded or otherwise shaped pads at the ends and other selected portions of the conductors so as to facilitate the attachment of terminals thereto.

So as to provide suitable test points and facilitate electrical connection between the rigid stacked circuit board and other boards or electronic equipment, the extended portions of the flexible cables possess terminals 26*a*, 27*a* and 28*a* which are joined to their respective flexible cables at or adjacent to the outer ends of the conductors 18, 19 and 20, respectively. As explained in our copending application Ser. No. 470,685 filed July 9, 1965, now issued Patent No. 3,325,691 dated June 13, 1967, the terminals 26*a*, 27*a* and 28*a* are preferably formed of small copper eyelets having flanges 30 (FIGURE 3) at the ends thereof for providing terminals to which other conductors can easily be soldered or into which the ends of the conductors can be inserted and soldered or forming contacts for switches and the like. The surface of the copper eyelets and the underside of the flange 30 are provided with a coating about 1 to 2 mils thick of a silver brazing alloy having a melting point at least 800° F. so that in response to the temperature generated by a welding device for a very short period of time, the brazing metal on the eyelets melts and brazes the eyelets together along with the conductors 18, 19 and 20, thus forming mechanically strong and electrically conductive joints between the eyelets and the conductors.

The stacked printed circuit board is further provided with terminals 32 which extend through each of the superposed flexible and rigid cables, and engage the conductors 18, 19 and 20, encapsulated in the flexible cables 10, 11 and 12, respectively, and the conductors 22, 23, 24 and 25 formed in the rigid cables 13, 14, 15 and 16, respectively. In the manner described above, eyelets, naturally longer than those which form the terminals in the flexible and rigid cables, are inserted into holes punched through the stacked printed circuit board and thereafter subjected to a welding cycle sufficient to melt the brazing alloy but not the eyelets and braze them to each other and to the conductors 18, 19 and 20 of the flexible cables with which they are in contact and to the conductors 22, 23, 24 and 25 formed in the rigid cables. The terminals 32 thereby form strong mechanical and electrically-conducting joints between the terminals 32 and the conductors of the rigid and flexible cables with which they are in contact. Terminals 32 are suitably arranged to receive the conductive pins of modules, the components themselves, micromodules or the ends of conductors. In a typical assembly of a complete stacked printed circuit board with associated electronics, the conductive pins of the modules or the ends of conductors are placed into the terminals 32 and thereafter soldered to the eyelets. The components contained in the inserted modules thereby have electrical access to any other components on the printed circuit board through the conductors of the flexible and rigid cables and to the terminals 26*a*, 27*a* and 28*a* of the flexible cable which provide access to external components or hardware.

In order to provide extended flexible cables which can easily be manipulated and to provide cables into which external circuitry and conductors can easily be inserted, the preferred embodiment of the invention possesses extended flexible cables 10*a*, 11*a* and 12*a* which have smaller widths than their corresponding portions adhered to the rigid cables. This is accomplished by tightly grouping the terminals 26*a*, 27*a* and 28*a* and laying out the foil-like conductors 18, 19 and 20 in such a manner that they are brought inwardly together for receiving the terminals in tightly grouped relation.

By extending the flexible cables 10, 11 and 12 out beyond the main body of the rigid stacked printed circuit board to form the extended portions 10*a*, 11*a* and 12*a* and by providing the terminations 26*a*, 27*a* and 28*a* in the flexible cables which can be connected to any conductors, electrical components, or modules placed on the printed circuit board, the stacked printed circuit of the present invention constitutes a marked improvement over presently devised printed circuit boards. Such features facilitate the making of electrical connections between the printed circuit board and associated boards or other equipment since the tabs 10*a*, 11*a* and 12*a* are flexible and can be manipulated where intricate cross wiring is required. Electronic components can be added to the existing circuitry on the board. Other types of hardware may be employed in the extended portions of the flexible cables, for example, rotary switch elements, microswitches or the like, required in the electronic equipment. Moreover, the terminals 26*a*, 27*a* and 28*a* may be formed in the flexible cable after the assembly of the complete stacked printed circuit board rather than before in order to suit special circuitry or hardware.

It will be understood that the invention is susceptible to considerable modification and is not limited to the above-described illustrated embodiment of the invention. For example, foil-like conductors could be formed alternatively in the rigid cables and the flexible cables rather than in all the cables, depending upon the requirements placed upon the board; the flexible cables need not be interposed between the rigid cables, but rather could be stacked in superposed relation supported on either end by a rigid base, and those portions of the flexible cables which extend beyond the main body of the stacked printed circuit board need not be substantially rectangular in shape, but rather could have a circular or any other type shape. Moreover, if required, the extended portions of the flexible cables 10*a*, 11*a* and 12*a* may be lengthened to nearly approximate the length of the composite stacked printed circuit board and likewise, can be shortened to provide a very small extension of the stacked printed circuit board. Accordingly, all such modifications are intended to be included in the scope of the following claims.

We claim:

1. A circuit board comprising a rigid circuit board having a plurality of layers of conductors, a plurality of flexible cables interposed between and insulated from said plurality of layers of conductors in said rigid board, said flexible cables containing conductors and including portions coextensive with said rigid circuit board and portions extending beyond the periphery of said board, terminals connected with the conductors in the portions of said flexible cables extending outwardly of said board, and a plurality of terminals extending through said rigid circuit board connecting conductors in said rigid circuit board with conductors in said flexible cables.

2. A rigid stacked printed circuit board as set forth in claim 1 wherein said rigid board comprises at least one rigidifying layer substantially coextensive therewith and a plurality of layers of foil-like conductors separated by layers of insulating plastic.

3. A rigid stacked printed circuit board as set forth in claim 1 wherein said flexible cables comprise flexible foil-like conductors encapsulated between layers of flexible plastic.

4. A rigid stacked printed circuit board as set forth in claim 1 wherein the terminals in said flexible cable and the terminals extending through said rigid circuit board comprise conductive members brazed to selected conductors with a brazing material having a melting point of at least 800° F.

References Cited

UNITED STATES PATENTS

| | | | |
|---|---|---|---|
| 3,202,869 | 8/1965 | Matson et al. | 317—101 X |
| 3,264,524 | 8/1966 | Dahlgren et al. | 174—68 X |

DARRELL L. CLAY, *Primary Examiner.*